(12) United States Patent
Yu et al.

(10) Patent No.: US 11,750,089 B2
(45) Date of Patent: Sep. 5, 2023

(54) POWER CONVERTER FOR HIGH POWER DENSITY

(71) Applicant: ALPHA AND OMEGA SEMICONDUCTOR INTERNATIONAL LP, Toronto (CA)

(72) Inventors: Ziwei Yu, Milpitas, CA (US); Lin Chen, San Jose, CA (US); Zhiqiang Niu, Santa Clara, CA (US)

(73) Assignee: ALPHA AND OMEGA SEMICONDUCTOR INTERNATIONAL LP, Toronto (CA)

( * ) Notice: Subject to any disclaimer, the term of this patent is extended or adjusted under 35 U.S.C. 154(b) by 92 days.

(21) Appl. No.: 17/513,341

(22) Filed: Oct. 28, 2021

(65) Prior Publication Data

US 2023/0137176 A1    May 4, 2023

(51) Int. Cl.
H05K 7/20       (2006.01)
H02M 1/44       (2007.01)
H05K 1/18       (2006.01)
H05K 1/11       (2006.01)

(52) U.S. Cl.
CPC ............ H02M 1/44 (2013.01); H05K 1/111 (2013.01); H05K 1/181 (2013.01); H05K 7/209 (2013.01); H05K 2201/10166 (2013.01)

(58) Field of Classification Search
CPC ............... H05K 7/209; H05K 2201/10166
USPC ............................................. 361/704
See application file for complete search history.

(56) References Cited

U.S. PATENT DOCUMENTS

| 2007/0164423 A1* | 7/2007 | Standing | H01L 24/73 257/E21.705 |
| 2011/0127675 A1* | 6/2011 | Ewe | H01L 25/0655 257/773 |
| 2013/0003305 A1* | 1/2013 | Stella | H01L 23/49575 361/709 |
| 2016/0172279 A1* | 6/2016 | Cho | H01L 23/49575 257/676 |
| 2018/0277513 A1* | 9/2018 | Macheiner | H01L 23/49844 |

* cited by examiner

Primary Examiner — Sherman Ng
(74) Attorney, Agent, or Firm — Chen-Chi Lin

(57) ABSTRACT

A power semiconductor package comprises a lead frame, a semiconductor chip, and a molding encapsulation. The lead frame comprises an elevated section comprising a source section; a drain section; and a plurality of leads. The semiconductor chip includes a metal-oxide-semiconductor field-effect transistor (MOSFET) disposed over the lead frame. The semiconductor chip comprises a source electrode, a drain electrode, and a gate electrode. The source electrode of the semiconductor chip is electrically and mechanically connected to the source section of the elevated section of the lead frame. The semiconductor chip is served as a low side field-effect transistor as a flipped-chip connected to a heat sink by a first thermal interface material. A high side field-effect transistor is connected to the heat sink by a second thermal interface material. The low side field-effect transistor and the high side field-effect transistor are mounted on a printed circuit board.

16 Claims, 6 Drawing Sheets

POWER CONVERTER FOR HIGH POWER DENSITY

FIELD OF THE INVENTION

This invention relates generally to a power converter for high power density applications. More particularly, the present invention relates to a power converter having a heat sink with reduced electromagnetic interference (EMI) emission.

BACKGROUND OF THE INVENTION

A power density target of power converters has been increased to higher levels in recent years. High power density applications refer to greater than 1,200 kilowatts per cubic meters. For one example, a USB-C charger having a power density of 1,500 kilowatts per cubic meters is considered as one high power density application. For another example, an electric vehicle on-board charger having a power density of 3,000 kilowatts per cubic meters is considered as one high power density application. As shown in FIG. 1, two field-effect transistors (FETs) are usually connected in series as a high side FET and a low side FET for power converter applications. The requirements for power converters targeting high power density applications include, not only on the FET components level, but also on the converter assembly level, lower package parasitic capacitance and inductance; lower electromagnetic interference (EMI) noise; better thermal dissipation capability; and easier printed circuit board design.

Conventional power converters experience high EMI noise in high power density applications. This results in reduction of the switching frequency (for example, reducing to 75%) and increase of a thickness of a thermal interface material (for example, from 50 microns to 100 microns) compromising with lower heat dissipation efficiency, lower power density, and lower power converter efficiency. There is a need for improvement of power converter to meet the challenge of high power density application.

SUMMARY OF THE INVENTION

The present invention discloses a power semiconductor package comprising a lead frame, a semiconductor chip, and a molding encapsulation. The lead frame comprises an elevated section comprising a source section; a drain section; and a plurality of leads. The semiconductor chip includes a metal-oxide-semiconductor field-effect transistor (MOSFET) disposed over the lead frame. The semiconductor chip comprises a source electrode, a drain electrode, and a gate electrode. The source electrode of the semiconductor chip is electrically and mechanically connected to the source section of the elevated section of the lead frame.

The semiconductor chip is served as a low side field-effect transistor as a flipped-chip connected to a heat sink by a first thermal interface material. A high side field-effect transistor is connected to the heat sink by a second thermal interface material. The low side field-effect transistor and the high side field-effect transistor are mounted on a printed circuit board.

DETAILED DESCRIPTION OF THE INVENTION

Figure 1:
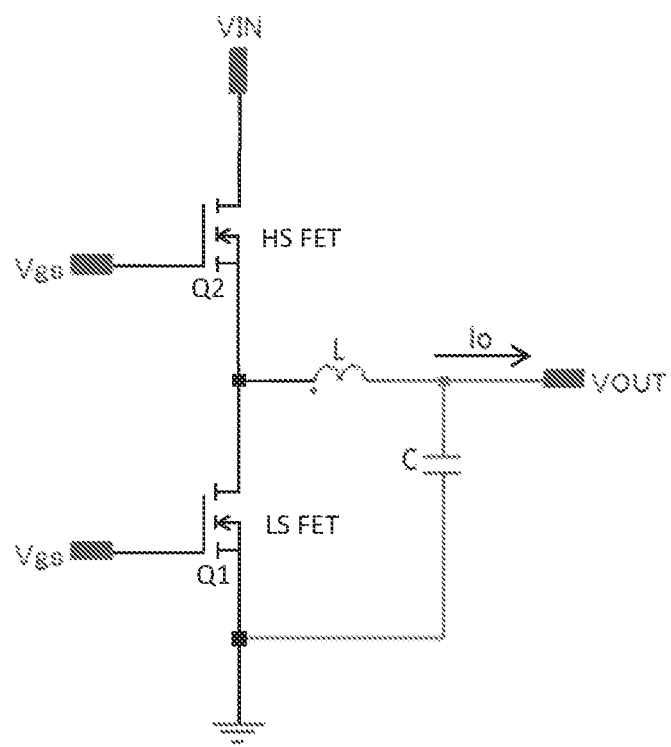
FIG. 1 is a circuit diagram of a conventional power converter.
Figure 2C:
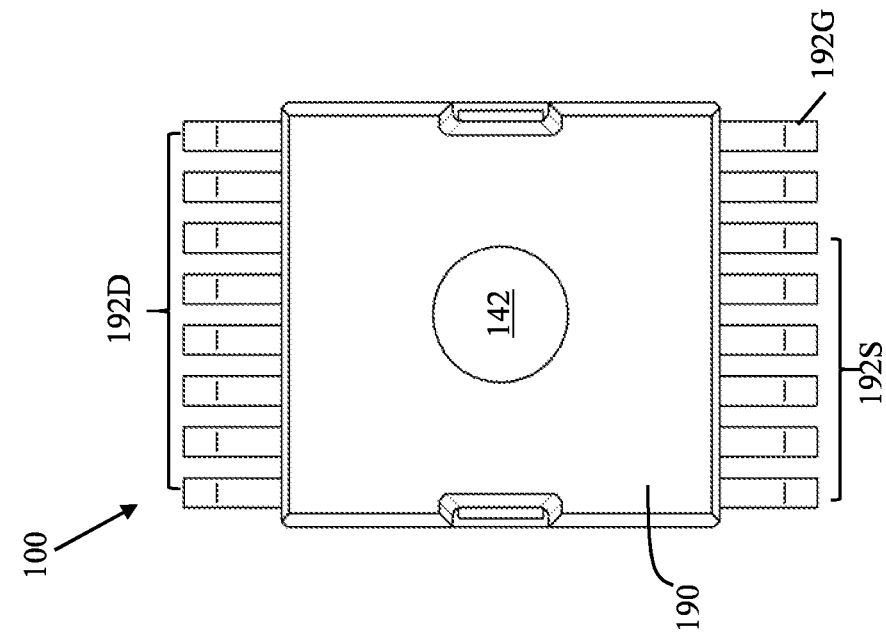
FIG. 2C is a top view of a conventional power semiconductor package.
Figure 2B:
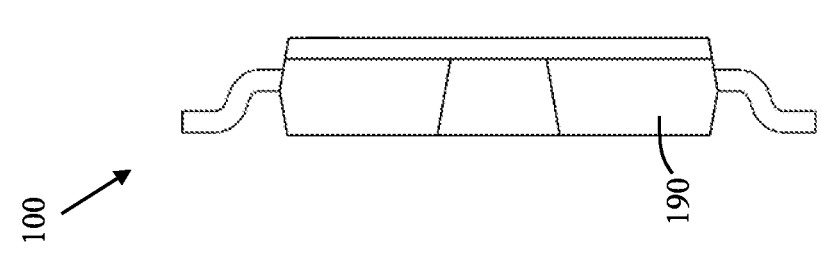
FIG. 2B is a side view.
Figure 2A:
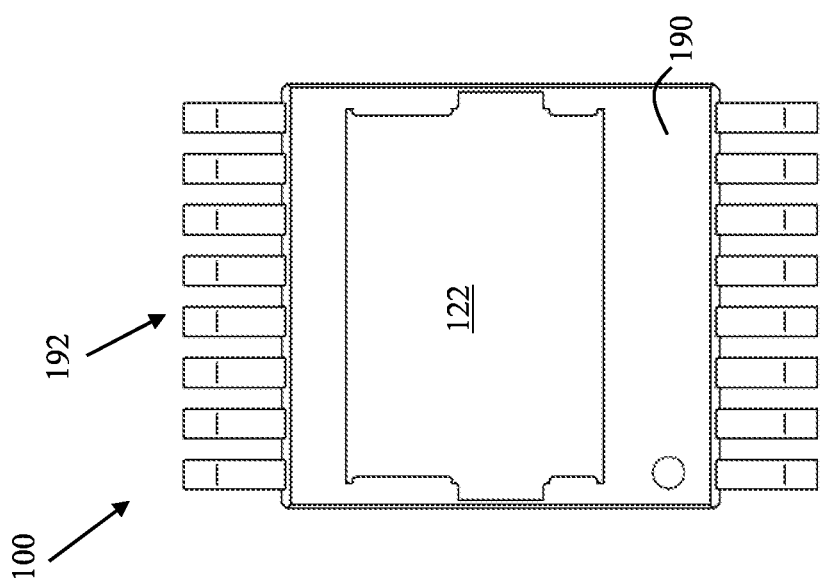
FIG. 2A is a bottom view.
Figure 4:
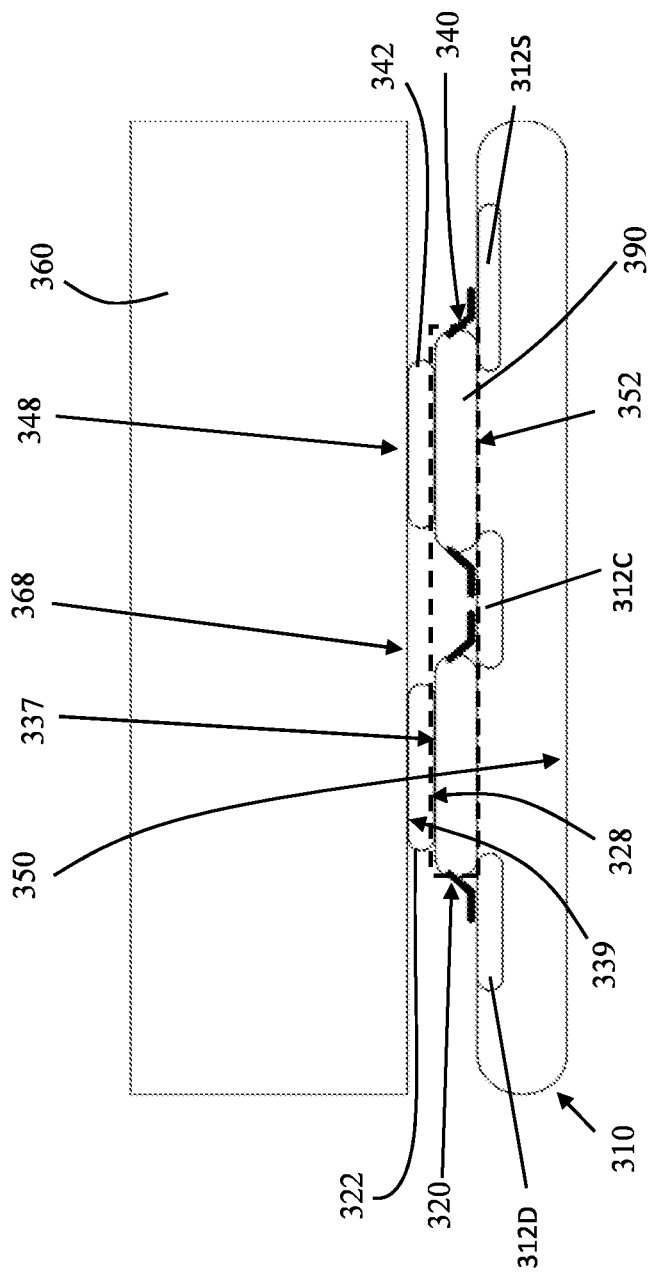
FIG. 4 shows a printed circuit board, a low side field-effect transistor, a high side field-effect transistor, and a heat sink in examples of the present disclosure.

FIG. 2A is a bottom view, FIG. 2B is a side view, and FIG. 2C is a top view of a power semiconductor package 100 used as a high side field-effect transistor 320 of a power converter of this invention in FIG. 4. The power semiconductor package 100 comprises a bottom source electrode 122 exposed from a bottom surface of a molding encapsulation 190, a top drain electrode 142 exposed from a top surface of the molding encapsulation 190, and a plurality of leads 192 extending to the bottom side with bottom surfaces of the plurality of leads 192 substantially coplanar to the bottom surface of the molding encapsulation 190. The molding encapsulation 190 has a first thickness measured from the bottom surface to the top surface of the molding encapsulation 190. The plurality of leads 192 including at least a high side source lead 192S, a high side gate lead 192G, and a high side drain lead 192D. The top drain electrode 142 exposed from the top surface of the molding encapsulation 190 is electrically connected to the high side drain lead 192D. The top drain electrode 142 exposed from the top surface of the molding encapsulation 190 greatly improves thermal dissipation when the field-effect transistor of power semiconductor package 100 carries high power switching operation.

In examples of the present disclosure, the language "substantially the same thickness" refers to less than or equal to 1% difference in thickness. In one example, if a first thickness is substantially the same as a second thickness, the second thickness is in a range from 99 microns to 101 microns when the first thickness is 100 microns. In examples of the present disclosure, the language "substantially coplanar" refers to less than 1 degree tilt.

Figure 3C:
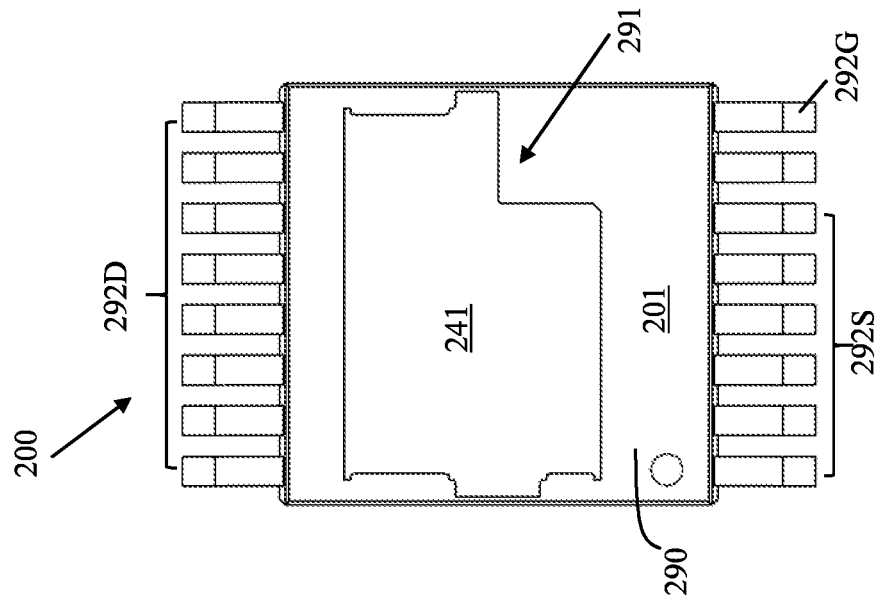
FIG. 3C is a top view of a power semiconductor package in examples of the present disclosure.
Figure 3B:
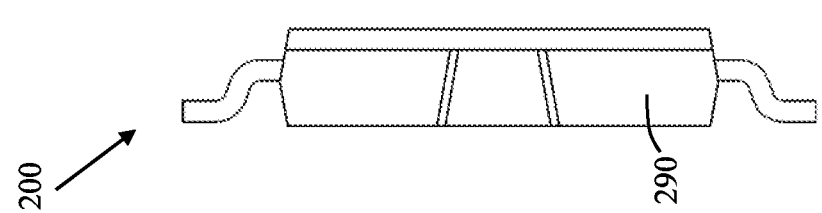
FIG. 3B is a side view.
Figure 3A:
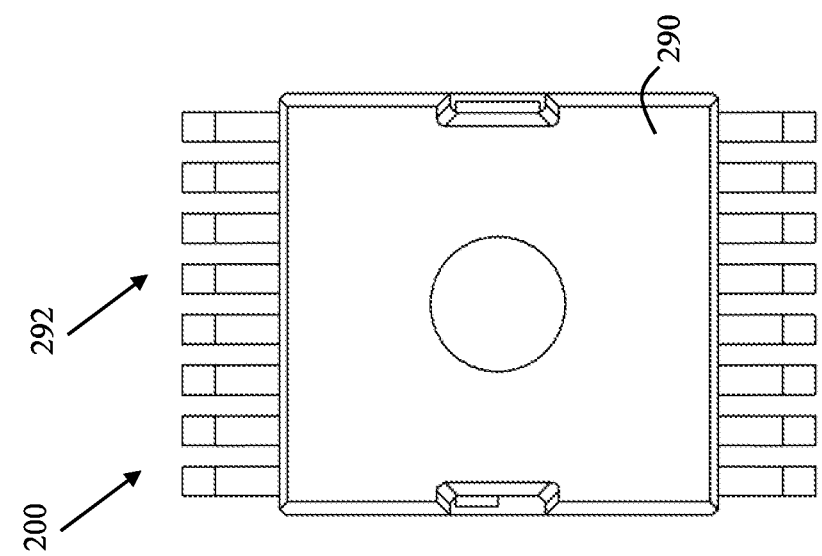
FIG. 3A is a bottom view.
Figure 5B:
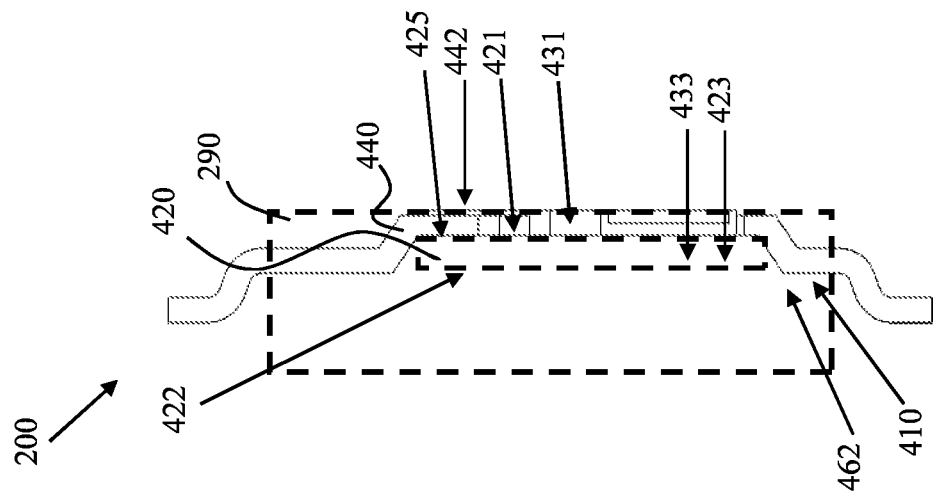
FIG. 5A is a top view and FIG. 5B is a side view of the power semiconductor package of FIGS. 3A, 3B, and 3C with molding encapsulation in dashed lines in examples of the present disclosure.
Figure 5A:
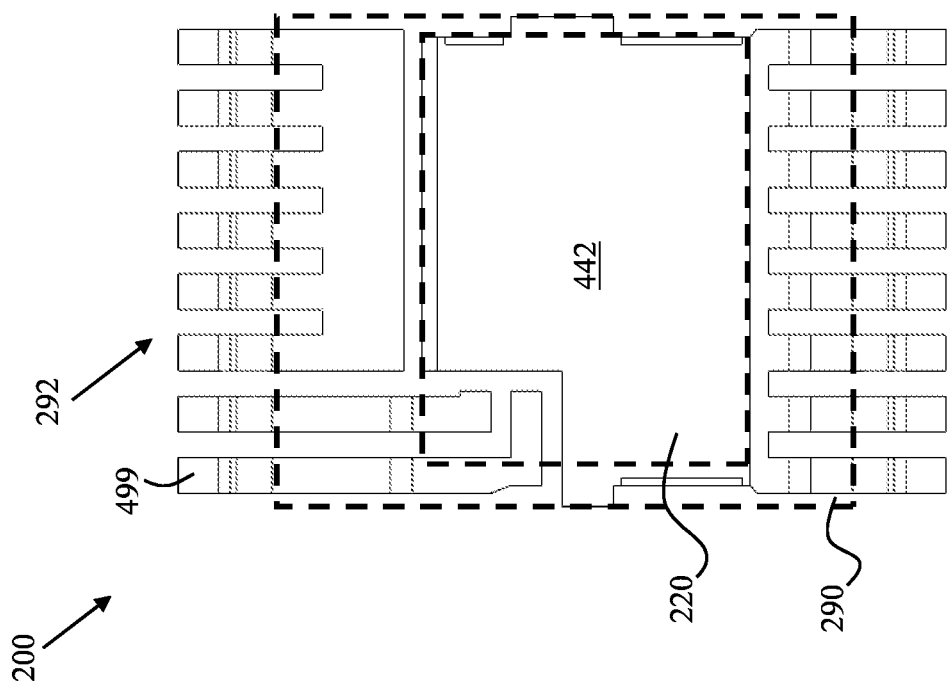

FIG. 3A is a bottom view, FIG. 3B is a side view, and FIG. 3C is a top view of a power semiconductor package 200 used as a low side field-effect transistor 340 of the power converter of this invention in FIG. 4. The power semiconductor package 200 comprises a top source electrode 241 exposed from a top surface of a molding encapsulation 290, and a plurality of leads 292 extending to the bottom side with bottom surfaces of the plurality of leads 292 substantially coplanar to the bottom surface of the molding encapsulation 290. The molding encapsulation 290 has a second thickness measured from the bottom surface to the top surface of the molding encapsulation 290. The plurality of leads 292 including at least a low side source lead 292S, a low side gate lead 292G, and a low side drain lead 292D. The top source electrode 241 exposed from the top surface of the molding encapsulation 290 is electrically connected to the low side source lead 292S. The top source electrode 241 exposed from the top surface of the molding encapsulation 290 greatly improves thermal dissipation when the field-effect transistor of power semiconductor package 200 carries high power switching operation. FIG. 5A is a top view and FIG. 5B is a side view of the power semiconductor package 200 with molding encapsulation (being transparent to show internal components) in dashed lines. The power semiconductor package 200 comprises a lead frame 410 of FIG. 5B, a semiconductor chip 420 (shown in dashed lines) of FIG. 5A and FIG. 5B, and a molding encapsulation 290. The lead frame 410 comprises an elevated section 440 comprising a source section 442; a drain section 462; and a plurality of leads 292.

The semiconductor chip 420 includes a metal-oxide-semiconductor field-effect transistor (MOSFET) 422 disposed over the lead frame 410. The semiconductor chip 420 comprises a source electrode 421, a drain electrode 423, and a gate electrode 425. The source electrode 421 is disposed on a first surface 431 of the semiconductor chip 420. The source electrode 421 is electrically and mechanically connected to the source section 442 of the elevated section 440 of the lead frame 410. The drain electrode 423 is disposed on a second surface 433 of the semiconductor chip 420. The drain electrode 423 is electrically and mechanically connected to the drain section 462 of the lead frame 410. The gate electrode 425 is disposed on the first surface 431 of the semiconductor chip 420. The gate electrode 425 is connected to a gate lead 499 of the plurality of leads 292.

The second surface 433 of the semiconductor chip 420 is opposite to the first surface 431 of the semiconductor chip 420. The semiconductor chip 420 and a majority portion of the lead frame 410 are embedded in the molding encapsulation 290. A majority portion of the elevated section 440 is embedded in the molding encapsulation 290. A majority portion refers to larger than 50%. A top source electrode 241 of FIG. 3C of a top surface area of the source section 442 of the elevated section 440 is exposed from the molding encapsulation 290. In one example, the top source electrode 241 of FIG. 3C of the top surface area of the source section 442 of the elevated section 440 is configured to connect to a heat sink 360 of FIG. 4 by a thermal interface material 342 of FIG. 4 so as to reduce an electromagnetic interference (EMI) noise for high power density applications.

In examples of the present disclosure, the top source electrode 241 of FIG. 3C of the top surface area of the source section 442 of the elevated section 440 is of a letter L shape so as to accommodate the gate electrode 425 under a region 291 of the molding encapsulation 290.

In one example, a surface area of the top source electrode 241 of FIG. 3C of the top surface area of the source section 442 of the elevated section 440 is in a range from 50% to 90% of a surface area of a top surface 201 of FIG. 3C of the power semiconductor package 200.

In another example, a surface area of the top source electrode 241 of FIG. 3C of the top surface area of the source section 442 of the elevated section 440 is in a range from 60% to 70% of a surface area of a top surface 201 of FIG. 3C of the power semiconductor package 200.

In examples of the present disclosure, the power semiconductor package 200 is a gull wing package (GWPAK) so that a respective exposed portion of each lead of the plurality of leads 292 is folded out from the molding encapsulation 290.

FIG. 4 shows a cross sectional view of a power converter 300 of present invention. The power converter 300 comprises a printed circuit board 310, a low side field-effect transistor 340 and a high side field-effect transistor 320 mounted on the printed circuit board 310, and a heat sink 360 disposed on the low side field-effect transistor 340 and the high side field-effect transistor 320. In examples of the present disclosure, the printed circuit board 310 includes a plurality of contact pads or cupper traces 312 for connections to the low side field-effect transistor 340 and the high side field-effect transistor 320 mounted thereon. The plurality of contact pads or cupper traces 312 include a switch nod pad 312C, a high side drain pad 312D, and a low side source pad 312S. The source lead 192S of high side field-effect transistor 320 and the drain lead 292D of low side field-effect transistor 340 are electrically connected to the switch nod pad 312C on the printed circuit board 310. The drain lead 192D of the high side field-effect transistor 320 is electrically connected to the high side drain pad 312D on the printed circuit board 310, and the source lead 292S of the low side field-effect transistor 340 is electrically connected to the low side source pad 312S on the printed circuit board 310. The plurality of contact pads or cupper traces 312 may further include a high side gate pad (not shown) electrically connected to the gate lead 192G of the high side field-effect transistor 320 and a low side gate pad (not shown) electrically connected to the gate lead 292G of the low side field-effect transistor 340.

In examples of the present disclosure, the low side field-effect transistor 340 is coupled to the heat sink 360 by the thermal interface material 342. The high side field-effect transistor 320 is coupled to the heat sink 360 by the thermal interface material 322. The heat sink 360 further improves thermal dissipation of the high side field-effect transistor 320 and the low side field-effect transistor 340 therefore improves power handling capability of the power converter 300.

In examples of the present disclosure, a thermal conductivity of the thermal interface material 322 and the thermal interface material 342 is greater than 15,000 watts per meter-kelvin. In one example, the thermal interface material 322 and the thermal interface material 342 are made of a ceramic-filled silicone elastomer material. In another example, the thermal interface material 322 and the thermal interface material 342 are made of a pyrolytic graphite material. In one example, the first thickness of the molding encapsulation 190 is different from the second thickness of the molding encapsulation 290. In another example, a thickness of the thermal interface material 322 plus the first thickness of the molding encapsulation 190 is substantial the same as a thickness of the thermal interface material 342 plus the second thickness of the molding encapsulation 290. In another example, thickness of the thermal interface material 322 is substantial the same the thickness of the thermal interface material 342. In another example, the first thickness of the molding encapsulation 190 is substantial the same as the second thickness of the molding encapsulation 290.

In examples of the present disclosure, a thickness of the thermal interface material 322 is in a range from 45 microns to 55 microns. A thickness of the thermal interface material 342 is in a range from 45 microns to 55 microns.

In examples of the present disclosure, the power semiconductor package 200 is used as a low side field-effect transistor 340 of FIG. 4. The top source electrode 241 of FIG. 3C is directly attached to a bottom surface of the thermal interface material 342. A top surface 348 of the thermal interface material 342 is directly attached to a bottom surface 368 of the heat sink 360. A high side parasitic capacitor forms between the top source electrode 241 and the heat sink 360 with the thermal interface material 342 functioning as a dielectric layer separating the two electrodes of the high side parasitic capacitor.

In examples of the present disclosure, the power semiconductor package 100 is used as a low side field-effect transistor 340 of FIG. 4. The top drain electrode 142 at a top surface area 328 of the high side field-effect transistor 320 is coupled to the heat sink 360 by a thermal interface material 322. The top surface area 328 of the high side field-effect transistor 320 is directly attached to a bottom surface 337 of the thermal interface material 322. A top surface 339 of the thermal interface material 322 is directly attached to a bottom surface 368 of the heat sink 360. A low side parasitic capacitor parasitic capacitance forms between the top drain electrode 142 and the heat sink 360 with the thermal interface material 322 functioning as a dielectric layer separating the two electrodes of the low side parasitic capacitor. For typical applications, the high side and low side parasitic capacitance are in the range of around 200 pF.

In examples of the present disclosure, the printed circuit board 310 comprises a bottom surface 350 and a top surface 352. The high side field-effect transistor 320 and the low side field-effect transistor 340 are mounted on the top surface 352 of the printed circuit board 310 sandwiched between the printed circuit board 310 and the heat sink 360. The heat sink 360 has a bottom surface facing and in parallel to the top surface 352 of the printed circuit board 310.

In examples of the present disclosure in high power density power converter applications, a voltage of the source electrode of the low side field-effect transistor 340 is fixed at a ground voltage. A voltage of the drain electrode (top drain electrode 142) of the high side field-effect transistor 320 is fixed at a bus voltage. The voltage of the heat sink 360 may be floating or tied to a fix voltage, such as the ground voltage of the source electrode of the low side field-effect transistor 340 or the bus voltage of top drain electrode 142) of the high side field-effect transistor 320. In any case, since no voltage changes at both the high side parasitic capacitor and the low side parasitic capacitor during switching operation, the parasitic high side capacitor and the parasitic low side capacitor attributed to the heat sink 360 will not emit EMI regardless the switching operation of the converter. The EMI of converter is thus minimized.

Figure 6B:
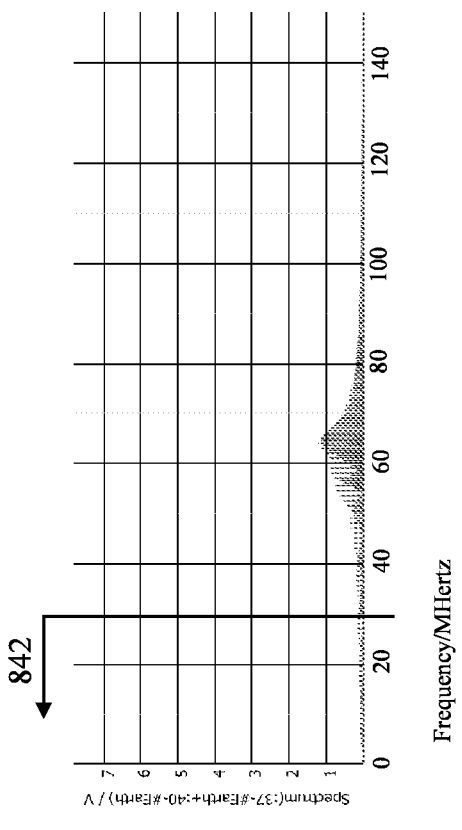
FIGS. 6A, 6B, 6C, and 6D show simulated EMI data in examples of the present disclosure.
Figure 6D:
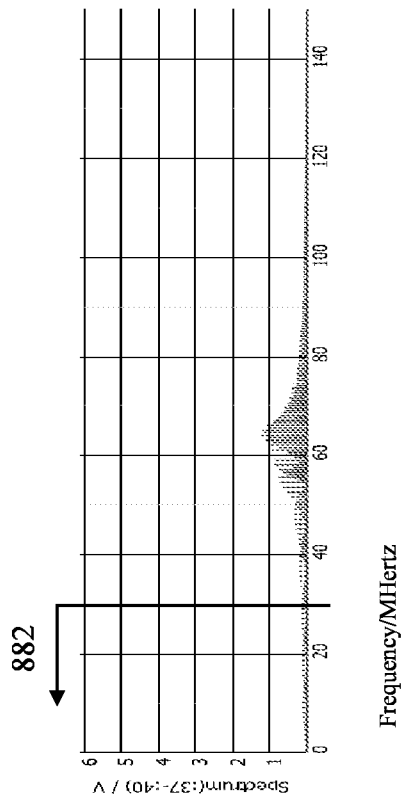
Figure 6A:
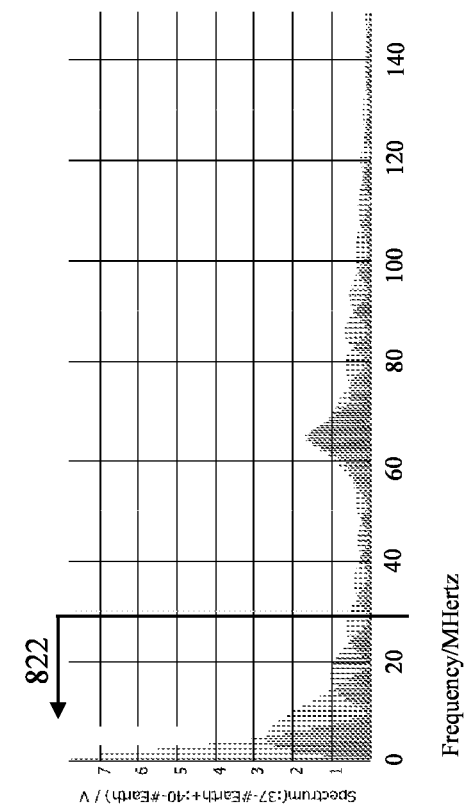
Figure 6C:
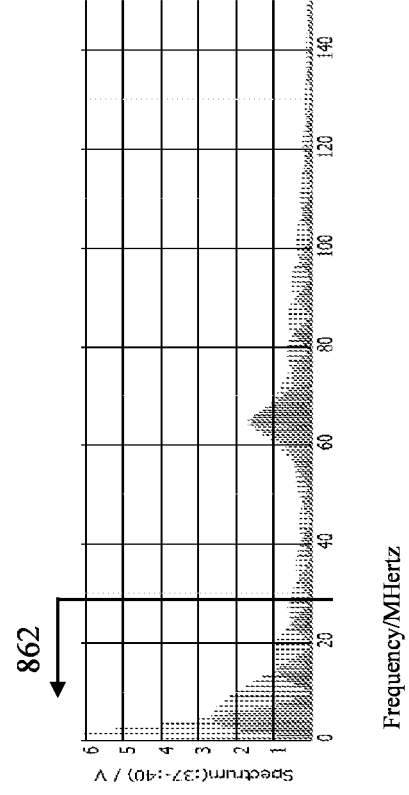

FIGS. 6A, 6B, 6C, and 6D show simulated EMI data in examples of the present disclosure. Horizontal axes represent switching frequencies in a linear scale starting at 0 Hz with 20 Mega Hertz increment per division. Vertical axes of FIGS. 6A and 6B represent common mode EMI noise with the same linear scale. Vertical axes of FIGS. 6C and 6D represent differential mode EMI noise with the same linear scale. It is worthy to note that in most applications the switching frequency is in the range below 30 Mega Hertz represented by the arrow 822 of FIG. 6A, the arrow 842 of FIG. 6B, the arrow 862 of FIG. 6C, and the arrow 882 of FIG. 6D.

FIG. 6A is for the case of a conventional power converter where the top surface electrode of the low side field-transistor is a drain electrode connected to the switching node. FIG. 6B is for the case of a power converter according to the invention of FIG. 4. For the range below 30 Mega Hertz, the highest common mode EMI noise of FIG. 6A is at level 7.8 and the highest common mode EMI noise of FIG. 6B is at level 0.1.

FIG. 6C is for the case of a conventional power converter where the top surface electrode of the low side field-transistor is a drain electrode connected to the switching node. FIG. 6D is for the case of a power converter according to the invention of FIG. 4. For the range below 30 Mega Hertz, the highest differential mode EMI noise of FIG. 6C is at level 6.0 and the highest common mode EMI noise of FIG. 6D is at level 0.1.

The converter according to this invention improves high power density applications greater than 1,200 kilowatts per cubic meters. For one example, the converter according to this invention is suitable for a USB-C charger having a power density of 1,500 kilowatts per cubic meters or higher power density application. For another example, the converter according to this invention is suitable for an electric vehicle on-board charger having a power density of 3,000 kilowatts per cubic meters or higher power density application.

Those of ordinary skill in the art may recognize that modifications of the embodiments disclosed herein are possible. For example, a size of the top source electrode 241 of FIG. 3C of a top surface area of the source section 442 of the elevated section 440, exposed from the molding encapsulation 290, may vary. Other modifications may occur to those of ordinary skill in this art, and all such modifications are deemed to fall within the purview of the present invention, as defined by the claims.

The invention claimed is:

1. A high power density power converter comprising:
    a printed circuit board comprising a plurality of contact pads isolated from one another, the plurality of the contact pads comprising a high side drain pad and a low side source pad;
    a high side field-effect transistor mounted on the printed circuit board, the high side field-effect transistor comprising
        a high side drain lead electrically connected to the high side drain pad of the printed circuit board; and
        a top drain electrode electrically connected to the high side drain lead;
    a low side field-effect transistor mounted on the printed circuit board, the low side field-effect transistor comprising
        a low side source lead electrically connected to the low side source pad of the printed circuit board; and
        a top source electrode electrically connected to the low side source lead;
    a heat sink disposed on top of the high side field-effect transistor and the low side field-effect transistor;
    a first thermal interface material layer coupling the top drain electrode of the high side field-effect transistor to the heat sink; and
    a second thermal interface material layer coupling the top source electrode of the low side field-effect transistor to the heat sink.

2. The high power density power converter of claim 1, wherein the plurality of the contact pads of the printed circuit board further comprises a switch node pad;
    wherein the high side field-effect transistor further comprises a high side source lead connected to the switch node pad of the printed circuit board; and
    wherein the low side field-effect transistor further comprises a low side drain lead connected to the switch node pad.

3. The high power density power converter of claim 2, wherein the plurality of the contact pads of the printed circuit board further comprises a high side gate pad and a low side gate pad;
    wherein the high side field-effect transistor further comprises a high side gate lead connected to the high side gate pad of the printed circuit board; and wherein the low side field-effect transistor further comprises a low side gate lead connected to the low side gate pad of the printed circuit board.

4. The high power density power converter of claim 2, wherein the high side field-effect transistor and the low side field-effect transistor are mounted on a top surface of the printed circuit board;
   wherein the high side field-effect transistor is sandwiched between the printed circuit board and the heat sink; and
   wherein the high side field-effect transistor is sandwiched between the printed circuit board and the heat sink.

5. The high power density power converter of claim 4, wherein the heat sink comprises a bottom surface facing the top surface of the printed circuit board; and
   wherein the bottom surface of the heat sink is parallel to the top surface of the printed circuit board.

6. The high power density power converter of claim 4, wherein a thickness of the first thermal interface material layer is substantially the same as a thickness of the second thermal interface material layer.

7. The high power density power converter of claim 4, wherein the high side field-effect transistor further comprises a first molding encapsulation having a first thickness; and
   wherein the low side field-effect transistor further comprises a second molding encapsulation having a second thickness.

8. The high power density power converter of claim 7, wherein the first thickness is the same as the second thickness.

9. The high power density power converter of claim 7, wherein the top source electrode of the low side field-effect transistor has an L shape exposing from a top surface of the second molding encapsulation.

10. The high power density power converter of claim 7, wherein an area of the top source electrode of the low side field-effect transistor exposing from the top surface of the second molding encapsulation is in a range from fifty percent to ninety percent of a top surface area of a package of the low side field-effect transistor.

11. The high power density power converter of claim 7, wherein an area of the top source electrode of the low side field-effect transistor exposing from the top surface of the first molding encapsulation is in a range from sixty percent to seventy percent of a top surface area of a package of the low side field-effect transistor.

12. The high power density power converter of claim 1, wherein the top drain electrode of the high side field-effect transistor is connected to a fixed bus voltage; and
   wherein the top source electrode of the low side field-effect transistor is connected to a ground.

13. The high power density power converter of claim 1, wherein a thermal conductivity of the first thermal interface material and a thermal conductivity of the second thermal interface material are greater than fifteen thousand watts per meter-kelvin.

14. The high power density power converter of claim 13, wherein the first thermal interface material and the second thermal interface material are selected from the group consisting of a ceramic-filled silicone elastomer material and a pyrolytic graphite material.

15. The high power density power converter of claim 13, wherein a thickness of the first thermal interface material and a thickness of the second thermal interface material are in a range from 45 microns to 55 microns.

16. The high power density power converter of claim 1, wherein a thermal conductivity of the first thermal interface material and a thermal conductivity of the second thermal interface material are greater than fifteen thousand watts per meter-kelvin.

* * * * *